United States Patent
Shih et al.

(10) Patent No.: US 9,343,415 B2
(45) Date of Patent: May 17, 2016

(54) COPPER POST STRUCTURE FOR WAFER LEVEL CHIP SCALE PACKAGE

(71) Applicant: TAIWAN SEMICONDUCTOR MANUFACTURING CO., LTD., Hsinchu (TW)

(72) Inventors: Chao-Wen Shih, Zhubei (TW); Yung-Ping Chiang, Zhubei (TW); Chen-Chih Hsieh, Tongxiao Township (TW); Hao-Yi Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/690,570

(22) Filed: Apr. 20, 2015

(65) Prior Publication Data
US 2015/0228597 A1    Aug. 13, 2015

Related U.S. Application Data

(63) Continuation of application No. 13/954,046, filed on Jul. 30, 2013, now Pat. No. 9,035,468.

(51) Int. Cl.
*H01L 23/00* (2006.01)
*H01L 21/78* (2006.01)
*H01L 21/56* (2006.01)

(52) U.S. Cl.
CPC ............... *H01L 24/11* (2013.01); *H01L 21/56* (2013.01); *H01L 21/78* (2013.01); *H01L 24/02* (2013.01); *H01L 24/03* (2013.01); *H01L 24/05* (2013.01); *H01L 24/13* (2013.01); *H01L 24/16* (2013.01); *H01L 24/92* (2013.01); *H01L 2224/0235* (2013.01); *H01L 2224/0236* (2013.01); *H01L 2224/0239* (2013.01); *H01L 2224/02311* (2013.01); *H01L 2224/02313* (2013.01); *H01L 2224/02321* (2013.01); *H01L 2224/03831* (2013.01); *H01L 2224/03912* (2013.01); *H01L 2224/03914* (2013.01); *H01L 2224/0401* (2013.01); *H01L 2224/05548* (2013.01); *H01L 2224/05647* (2013.01); *H01L 2224/1182* (2013.01); *H01L 2224/11831* (2013.01); *H01L 2224/13007* (2013.01);
(Continued)

(58) Field of Classification Search
CPC ........... H01L 2224/13007; H01L 2224/13008; H01L 2224/13009; H01L 2224/13147
See application file for complete search history.

(56) References Cited

U.S. PATENT DOCUMENTS

8,736,050 B2 * 5/2014 Huang .................... H01L 24/81
257/621
2011/0074025 A1 3/2011 Yanase et al.

*Primary Examiner* — Roy Potter
*Assistant Examiner* — Paul Patton
(74) *Attorney, Agent, or Firm* — Maschoff Brennan (57) ABSTRACT

In a method for forming a packaging structure, a metal pad is formed on a semiconductor substrate, and a first polymer insulating layer is formed over the semiconductor substrate. An opening passing through the first polymer insulating layer is formed to expose a portion of the metal pad. A copper-containing material is deposited in the opening and over the first polymer insulating layer, thereby forming a copper-containing layer having a first thickness and a first width over the first polymer insulating layer. A conductive bump having a second width is formed over the copper-containing layer, in which the second width is smaller than the first width. An exposed portion of the copper-containing layer is etched using the conductive bump as a mask until the exposed portion is reduced to a second thickness, thereby forming a monolithic copper-containing structure.

20 Claims, 12 Drawing Sheets

(52) U.S. Cl.
CPC ............... *H01L 2224/13022* (2013.01); *H01L 2224/1369* (2013.01); *H01L 2224/13111* (2013.01); *H01L 2224/13147* (2013.01); *H01L 2224/16225* (2013.01); *H01L 2224/16237* (2013.01); *H01L 2224/9212* (2013.01)

COPPER POST STRUCTURE FOR WAFER LEVEL CHIP SCALE PACKAGE

CROSS-REFERENCE TO RELATED APPLICATIONS

This application is a continuation of U.S. Non-Provisional application Ser. No. 13/954,046, filed Jul. 30, 2013, which is incorporated herein by reference in its entirety.

TECHNICAL FIELD

The present invention relates generally to wafer level chip scale packaging (WLCSP), and more particularly to a copper post used in WLCSP.

BACKGROUND

Wafer-level packaging (WLP) packages an integrated circuit (IC) at wafer level. WLP is essentially a true chip scale package (CSP) technology, because the resulting package is practically the same size as the die. In a typical wafer level chip scale packaging (WLCSP), copper (Cu) posts are used to enhance the robustness for fine pitch or large die WLP. In general, a Cu post WLCSP process requires three or four lithographic masks. In the case of three-mask process, the photolithographic processes are used for forming a first polymer insulating layer, a redistribution line (RDL) and an under-bump metallurgy (UBM)/copper post respectively. In the case of four-mask process, the photolithographic processes are used for forming a first polymer insulating layer, a RDL, a second polymer insulating layer and a UBM/copper post respectively. Photolithographic operations, along with the costs to produce a photomask, are a significant portion of semiconductor manufacturing costs. Improvements in methods and structure of WLCSP having Cu post continue to be sought.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed. When a layer is referred to as being on another layer or "on" a substrate, it may be directly on the other layer or on the substrate, or intervening layers may also be present. Throughout this disclosure, the term "copper (Cu) post" refers to a copper protrusion, a copper pillar, a thick copper pad and/or a copper-containing protrusion. As used throughout this disclosure, the term "copper" or "copper-containing" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Embodiments of the present disclosure are directed to one step copper plating with an etch back process so as to form a post-passivation interconnect (PPI) line and a copper post using two-mask processes, thus achieving a low cost WLCSP in comparison with the conventional three-mask process and four-mask process. The Cu post and the PPI line including a RDL are formed from one piece of copper or copper-containing layer, and the Cu post may provide more robustness to a BGA (Ball Grid Array) ball mounted thereon, because no interface exists between the Cu post and the PPI line.

Figure 1A:
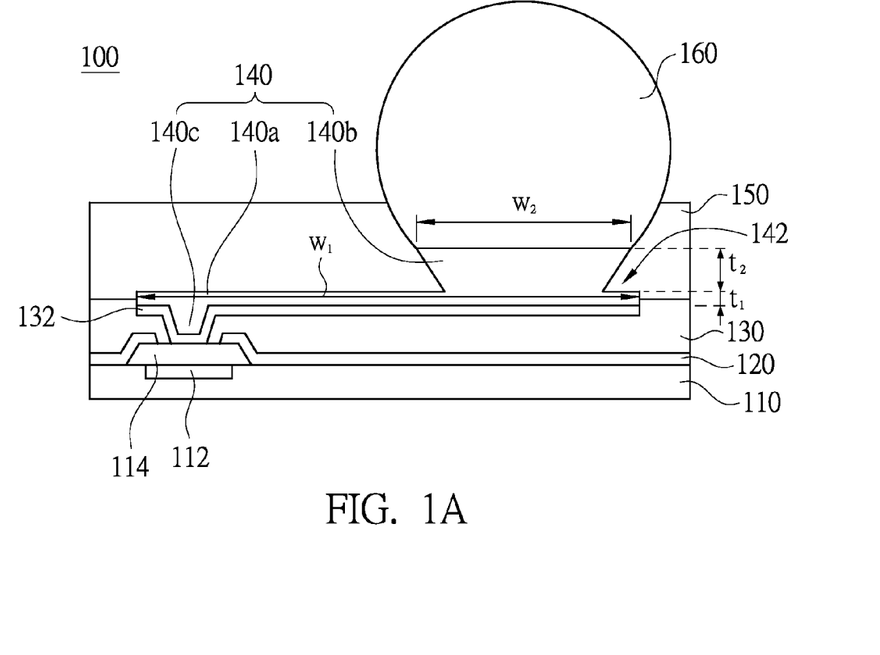
FIG. 1A and FIG. 1B are schematic cross-sectional views of packaging structures for various embodiments.
Figure 1B:
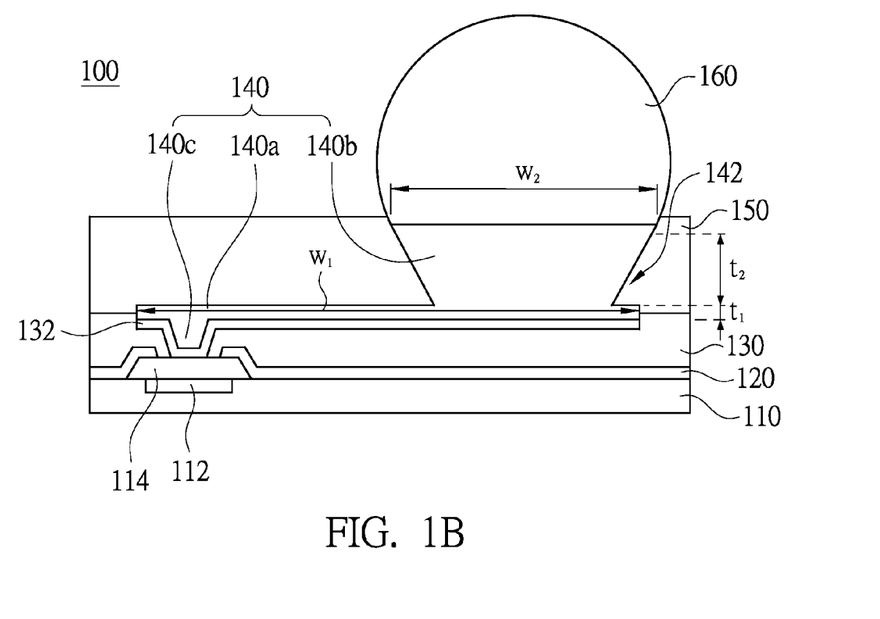

FIG. 1A and FIG. 1B are schematic cross-sectional views of packaging structures for various embodiments. As shown in FIG. 1A, a packaging structure 100 includes a semiconductor substrate 110, a metal pad 114, a first polymer insulating layer 130, a monolithic copper-containing structure 140, a conductive bump 160 and a second polymer insulating layer 150. The semiconductor substrate 110 has an interconnect structure formed therein. The semiconductor substrate 110 is defined to mean any construction including semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices. The interconnect structure further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. Metal lines in the metallization structure may be formed of copper or copper alloys. One skilled in the art will realize the formation details of the metallization layers.

The metal pad 114 is disposed on a top metallization layer 112 of the interconnect structure. In some embodiments, the metal pad 114 includes aluminum (Al), copper (Cu), silver (Ag), gold (Au), nickel (Ni), tungsten (W), alloys thereof, and/or multi-layers thereof. A passivation layer 120, such as silicon nitride or silicon oxide, may overlie the semiconductor substrate 110 and cover a portion of the metal pad 114. The first polymer insulating layer 130 overlies the passivation layer 120 and covers the portion of the metal pad 114. In some embodiments, the first polymer insulating layer 130 includes an epoxy, polyimide, benzocyclobutene (BCB), polybenzoxazole (PBO), or the like.

Figure 1C:
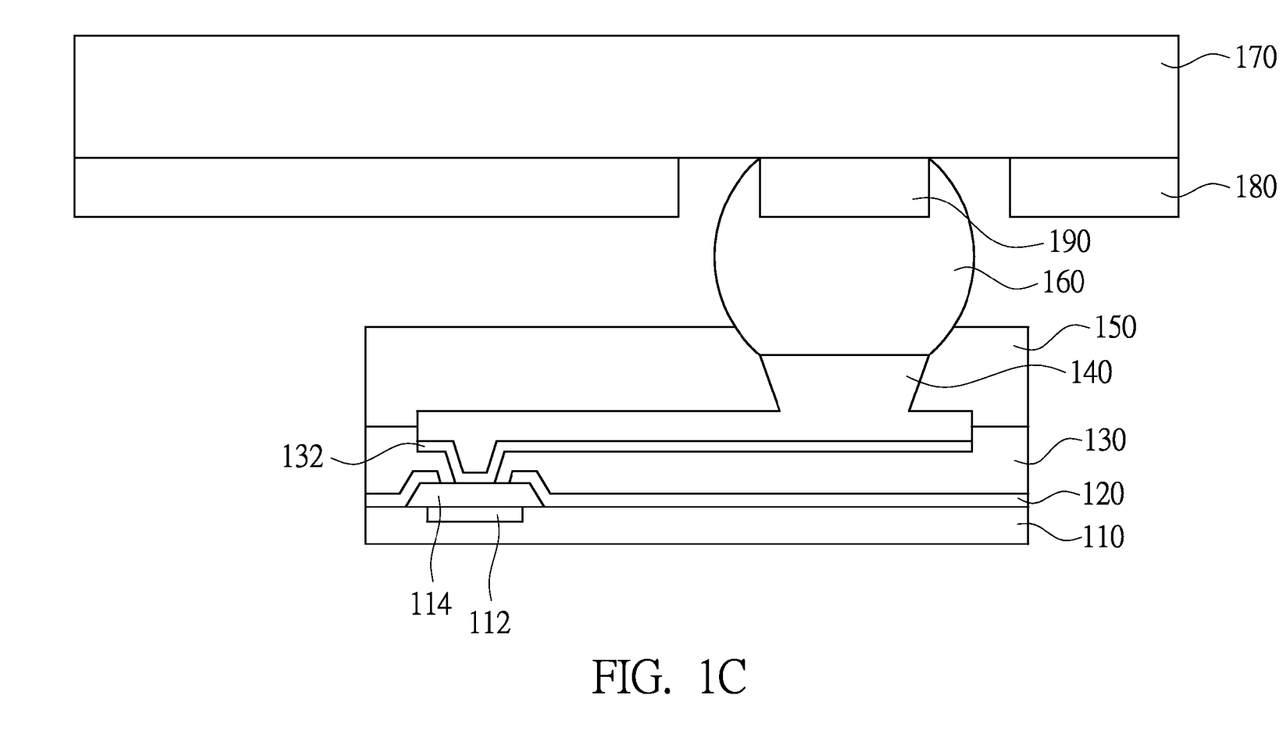
FIG. 1C is a schematic view of a packaging structure with a printed circuit board for various embodiments.

The monolithic copper-containing structure 140 is disposed over the portion of the metal pad 114 and the first polymer insulating layer 130, and is electrically connected to the portion of the metal pad 114. Before the formation of the monolithic copper-containing structure 140, a seed layer 132 may overlay the metal pad 114 and the first polymer insulating layer 130. The seed layer 132 may be a copper seed layer or formed of copper alloys that include silver, chromium, nickel, tin, gold, and combinations thereof. The conductive bump 160, such as a Sn/Pb or Sn/Ag solder bump, is disposed over the top portion of the monolithic copper-containing structure 140 for mounting a printed circuit board 170, on which a solder mask 180 and a copper pad 190 are formed, as shown in FIG. 1C. The second polymer insulating layer 150 encapsulates the monolithic copper-containing structure 140 and a portion of the conductive bump 160. In some embodiments, the second polymer insulating layer 150 includes an epoxy, polyimide, BCB, PBO, or the like. In certain embodiments, the second polymer insulating layer 150 includes an electromagnetic compatibility (EMC) coating.

The monolithic copper-containing structure 140 includes a via portion 140c, a bottom portion 140a and a top portion 140b adjoining the bottom portion 140a. The via portion 140c contacts the metal pad 114 embedded in the first polymer insulating layer 130. The bottom portion 140a has a first thickness t1 and a first width w1, and includes a PPI line. The PPI line may also function as a power line, a RDL, an inductor, a capacitor or any passive component. The top portion 140b has a second thickness t2 and a second width w2, in which the second thickness t2 is greater than the first thickness t1, and the first width w1 is greater than the second width w2. In other words, the top portion 140b protrudes from the bottom portion 140a. In some embodiments, the first thickness t1 ranges from about 4 μm to about 10 μm. In some embodiments, the second thickness t2 ranges from about 15 μm to about 25 μm, and is referred to as a thick copper pad, as shown in FIG. 1A. In certain embodiments, the second thickness t2 is greater than about 35 μm, and is referred to as a copper pillar, as shown in FIG. 1B.

The profile of the top portion 140b is formed by wet etching one piece of copper layer, and the wet etching creates an undercut structure 142 between the top portion 140b and the bottom portion 140a, such that a top surface of the top portion 140b is larger than a bottom surface of the top portion 140b. A stress buffer layer is formed from the second polymer insulating layer 150 filling the undercut structure 142 between the top portion 140b and the bottom portion 140a without needing any additional process. The stress buffer layer can release the stress imposed by the conductive bump 160 and the top portion 140b (thick copper pad or copper pillar). Because the top portion 140b (copper pillar or thick copper pad) and the bottom portion 140a (PPI line) are formed from one piece of copper layer, no interface exists between the top portion 140b and the bottom portion 140a. Thus, the top portion 140b may provide more robustness to the conductive bump 160 mounted thereon.

Figure 2A:
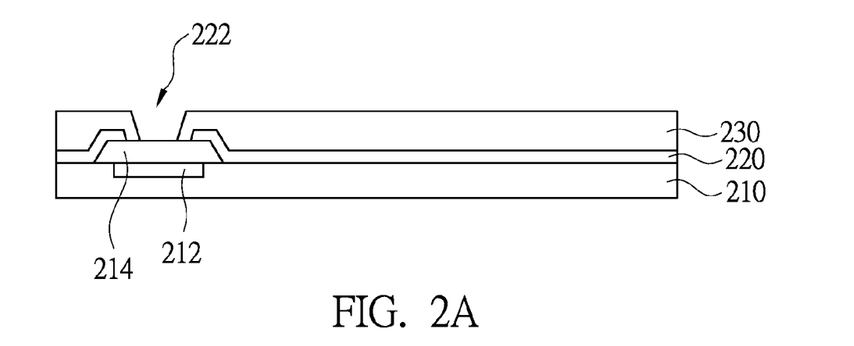
FIG. 2A-FIG. 2K are schematic cross-sectional views of intermediate stages showing a method for fabricating a packaging structure in accordance with some embodiments.

FIG. 2A-FIG. 2K are schematic cross-sectional views of intermediate stages showing a method for fabricating a packaging structure in accordance with some embodiments. As shown in FIG. 2A, a metal pad 214 is formed on a top metallization layer 212 of an interconnect structure formed in a semiconductor substrate 210. In some embodiments, the metal pad 214 includes aluminum (Al), copper (Cu), silver (Ag), gold (Au), nickel (Ni), tungsten (W), alloys thereof, and/or multi-layers thereof. A passivation layer 220, such as silicon nitride or silicon oxide, is formed on the semiconductor substrate 210. The first polymer insulating layer 230 is formed over the passivation layer 220 and exposes a portion of the metal pad 214. In some embodiments, the first polymer insulating layer 230 includes an epoxy, polyimide, benzocyclobutene (BCB), polybenzoxazole (PBO), or the like. An opening 222 passing through the passivation layer 220 and the first polymer insulating layer 230 is formed by using a first mask process to expose a portion of the metal pad 214.

Figure 2B:
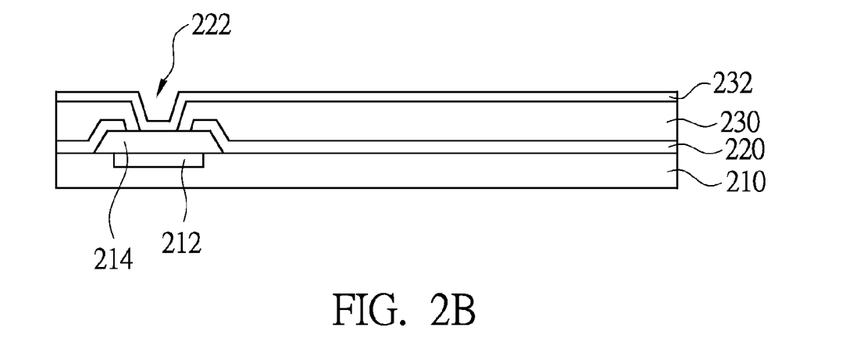
Figure 2C:
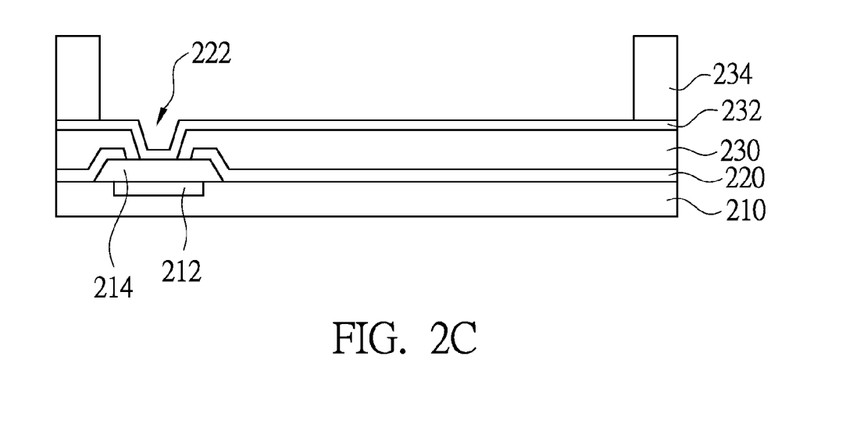
Figure 2D:
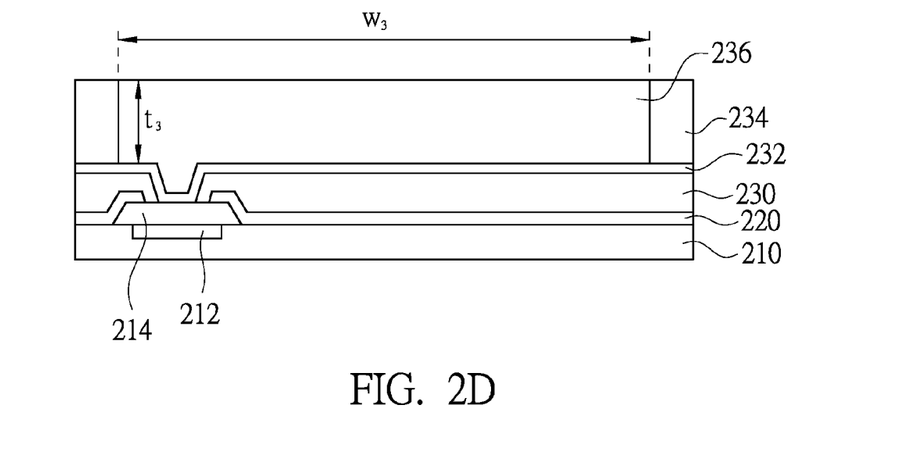
Figure 2E:
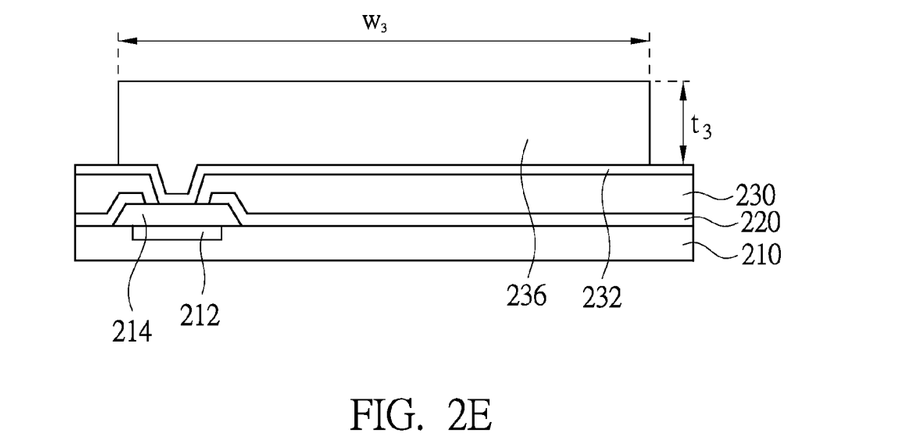

As shown in FIG. 2B, a seed layer 232 is formed over the portion of the metal pad 214 and the first polymer insulating layer 230. The seed layer 232 may be a copper seed layer or formed of copper alloys that include silver, chromium, nickel, tin, gold, and combinations thereof. As shown in FIG. 2C, a photolithographic process (a second mask process) is performed to form a patterned photoresist 234 on the seed layer 232. As shown in FIG. 2D, a copper-containing material 236 is disposed in the opening 222 and over the first polymer insulating layer 230. The methods for depositing the copper-containing material include sputtering, printing, electro plating, electroless plating, or chemical vapor deposition (CVD) methods. For example, electro-chemical plating (ECP) is carried out to deposit the copper-containing material. Then, the patterned photoresist 234 is stripped, thereby forming a copper-containing layer 236 having a thickness t3 and a width w3, as shown in FIG. 2E. When a thick copper pad as shown in FIG. 1A is desired, the thickness t3 is about or greater than about 20 μm. When a copper pillar as shown in FIG. 1B is desired, the thickness t3 is about or greater than about 40 μm.

Figure 2F:
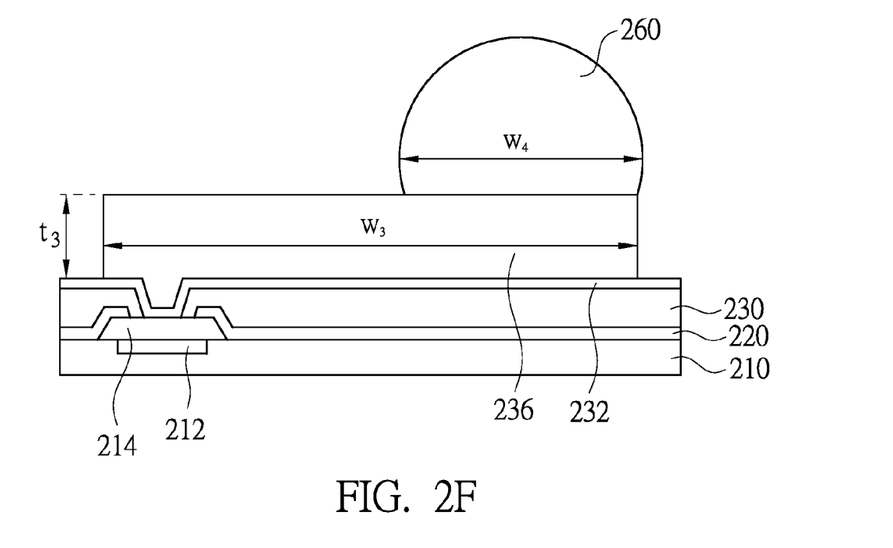
Figure 2G:
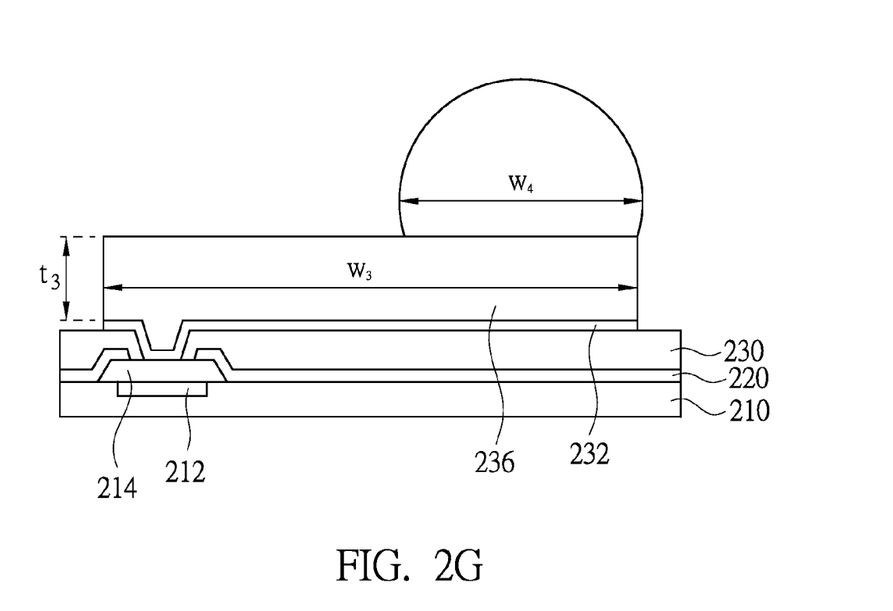
Figure 2H:
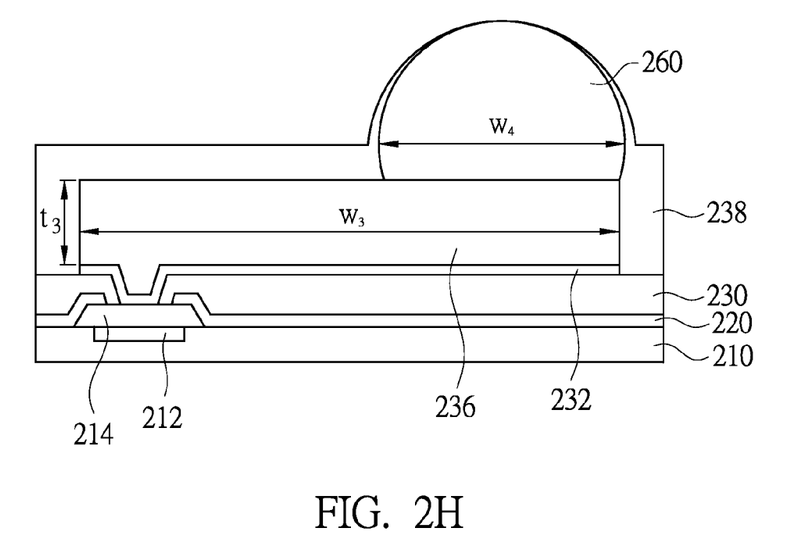
Figure 2I:
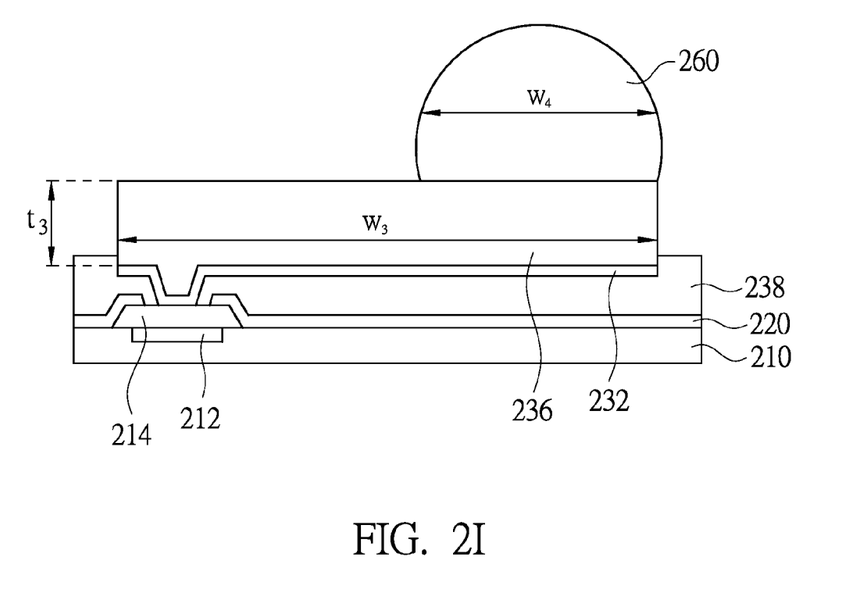
Figure 2J:
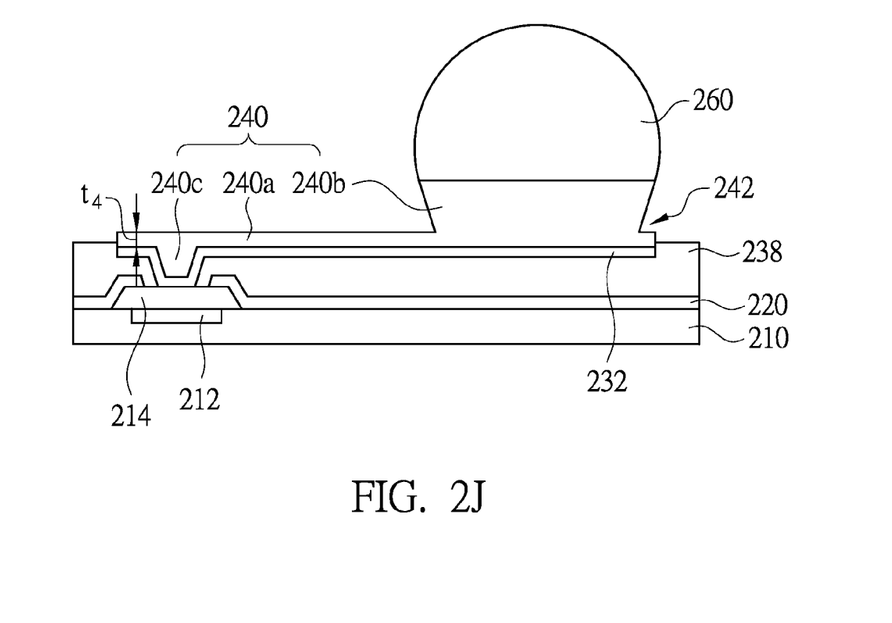

As shown in FIG. 2F, a conductive bump 260, such as a Sn/Pb or Sn/Ag solder bump, is formed over the copper-containing layer 236. The conductive bump 260 has a width w4, in which the width w4 is smaller than the width w3 of the copper-containing layer 236 for determining the width of a copper pillar or a thick copper pad to be formed. Then, the seed layer 232 exposed from the copper-containing layer 236 is removed, as shown in FIG. 2G. In certain embodiments, the seed layer 232 exposed from the copper-containing layer 236 may be removed before the conductive bump 260 is formed, or after the patterned photoresist 234 is stripped. In some embodiments, another polymer insulating layer 238 may be formed to encapsulate the monolithic copper-containing layer 236 and a portion of the conductive bump 260, as shown in FIG. 2H, and then the polymer insulating layer 238 is etched to expose the conductive bump 260 and an upper part of the copper-containing layer 236, as shown in FIG. 2I, i.e. the polymer insulating layer 238 encloses a lower part of the copper-containing layer 236. Thereafter, an exposed portion of the copper-containing layer 236 is etched by wet etching using the conductive bump 260 as a mask until the exposed portion of the copper-containing layer 236 is reduced to a thickness t4, thereby forming a monolithic copper-containing structure 240, as shown in FIG. 2J. In some embodiments, the wet etching is an acid or alkaline etching for selectively removing the copper in the presence of the conductive bump 260. In some embodiments, the thickness t4 ranges from about 4 μm to about 10 μm, and the monolithic copper-containing structure 240 includes a via portion 240c, a bottom portion 240a and a top portion 240b that forms an undercut structure 242. In certain embodiment, the polymer insulating layer 238 in FIG. 2H and FIG. 2I are not required, the wet etching is performed right after the exposed seed layer is removed (FIG. 2G), so as to form monolithic copper-containing structure similar to that shown in FIG. 1A or FIG. 1B. Because no interface or joint exists between the top portion 240b (copper pillar or thick copper pad) and the bottom portion 240a (PPI line), the top portion 240b is a robust support of the conductive bump 260.

Figure 2K:
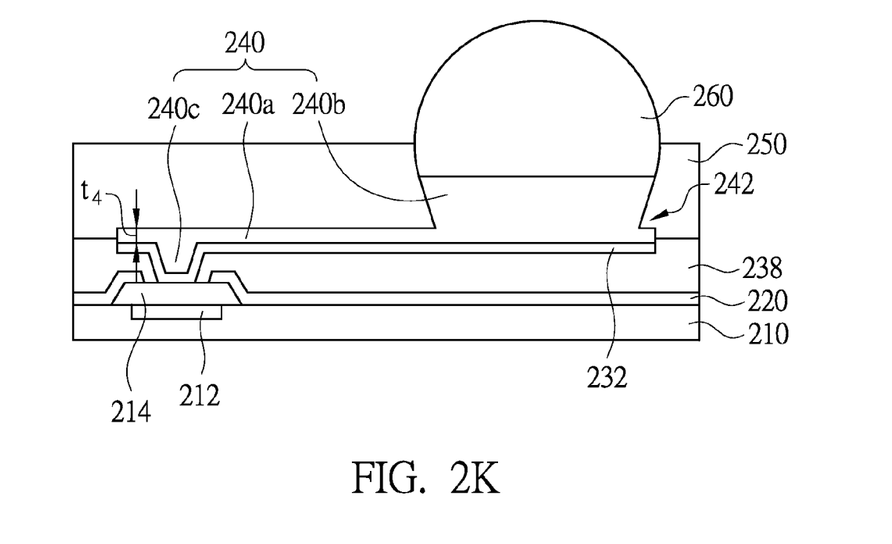

As shown in FIG. 2K, a second polymer insulating layer 250 is formed to encapsulate the monolithic copper-containing structure 240 and a portion of the conductive bump 260. The second polymer insulating layer 250 filling the undercut structure 242 between the top portion 240b and the bottom portion 240a can form a stress buffer layer to release the stress imposed by the conductive bump 260 and the top portion 240b. In some embodiments, the second polymer insulating layer 250 includes an epoxy, polyimide, BCB, PBO, or the like. In certain embodiments, the second polymer insulating layer 250 includes an EMC coating. In the aforementioned embodiments of the present disclosure, only two lithographic level masks (i.e. two-mask process) are needed for forming the opening 222 (FIG. 2A) and the patterned photoresist 234 (FIG. 2C) respectively. The two-mask process has lower cost than the conventional three-mask process and four-mask process. For example, the two-mask process may reduce the fabrication cost of the four-mask process by about 25%.

Figure 3A:
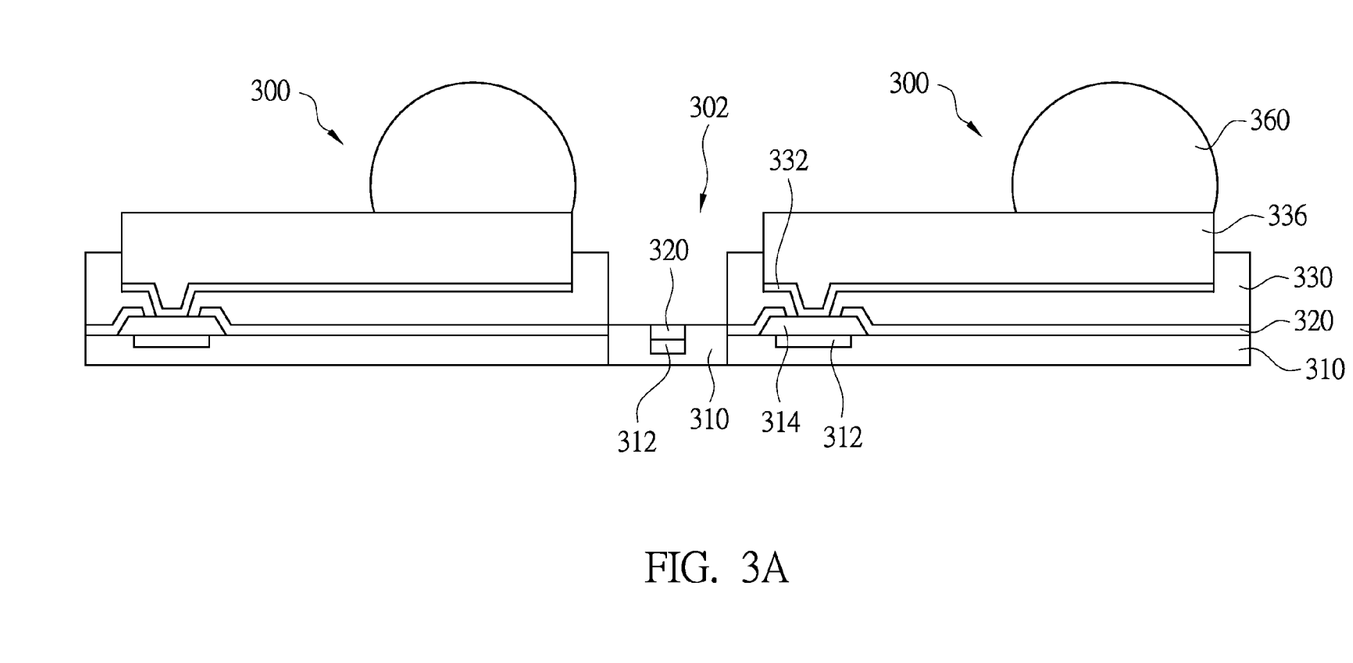
FIG. 3A-FIG. 3D are schematic cross-sectional views of intermediate stages showing a method for fabricating a packaging structure with a scribe lane in accordance with some embodiments.
Figure 3B:
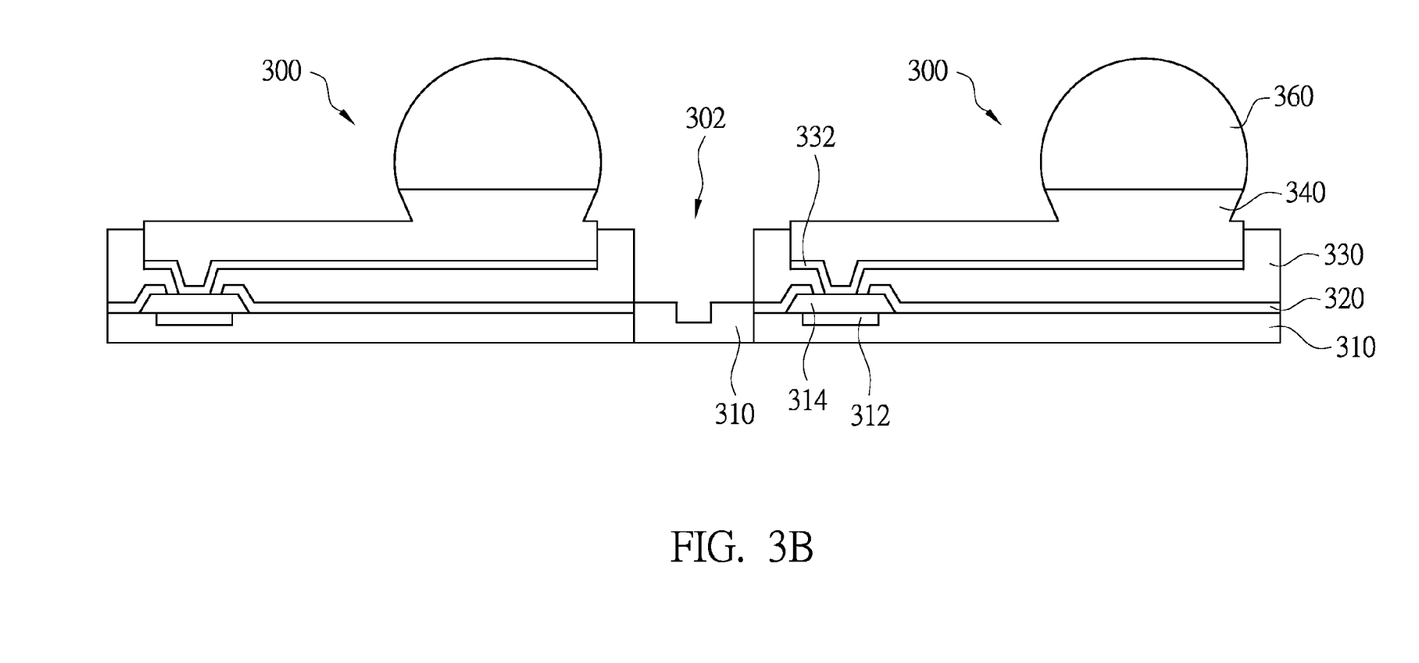

FIG. 3A-FIG. 3D are schematic cross-sectional views of intermediate stages showing a method for fabricating a packaging structure with a scribe lane in accordance with some embodiments. As shown in FIG. 3A, two semiconductor devices 300 and a scribe lane 302 between the semiconductor devices 300 are formed on a semiconductor substrate 310, in which the semiconductor substrate 310 has an interconnect structure formed therein. Each packaging structure 300 is formed by the operations shown in FIG. 2A-FIG. 2H. In each packaging structure 300, a metal pad 314 is formed on a top metallization layer 312 of the interconnect structure, and a passivation layer 320 is formed over a semiconductor substrate 310 and exposes a portion of a metal pad 314. The passivation layer 320 and the interconnect structure including the top metallization layer 312 are also formed on the scribe lane 302 in a scribe lane opening. The first polymer insulating layer 330 is formed over the passivation layer 320 and exposes the portion of the metal pad 314. A copper-containing layer 336 is formed over the portion of the metal pad 314 and the first polymer insulating layer 330, and is electrically connected to the portion of the metal pad 314. Before the formation of the copper-containing layer 336, a seed layer 332 is formed over the portion of the metal pad 314 and the first polymer insulating layer 330. The conductive bump 330 is formed over the copper-containing layer 336.

Figure 3C:
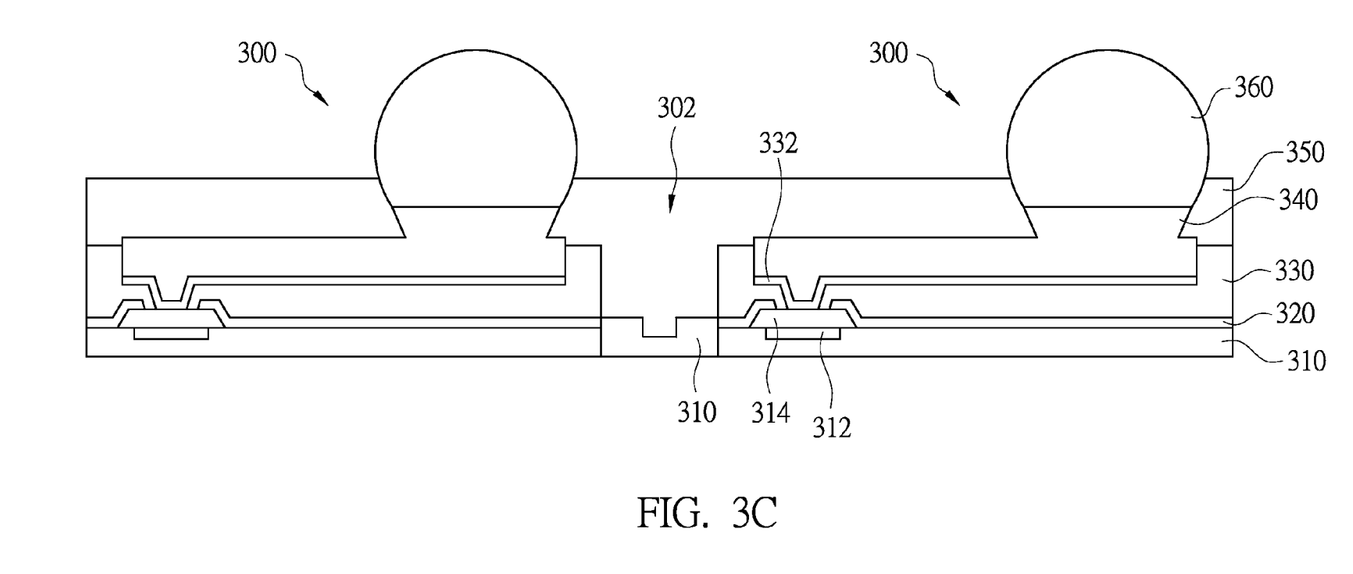
Figure 3D:
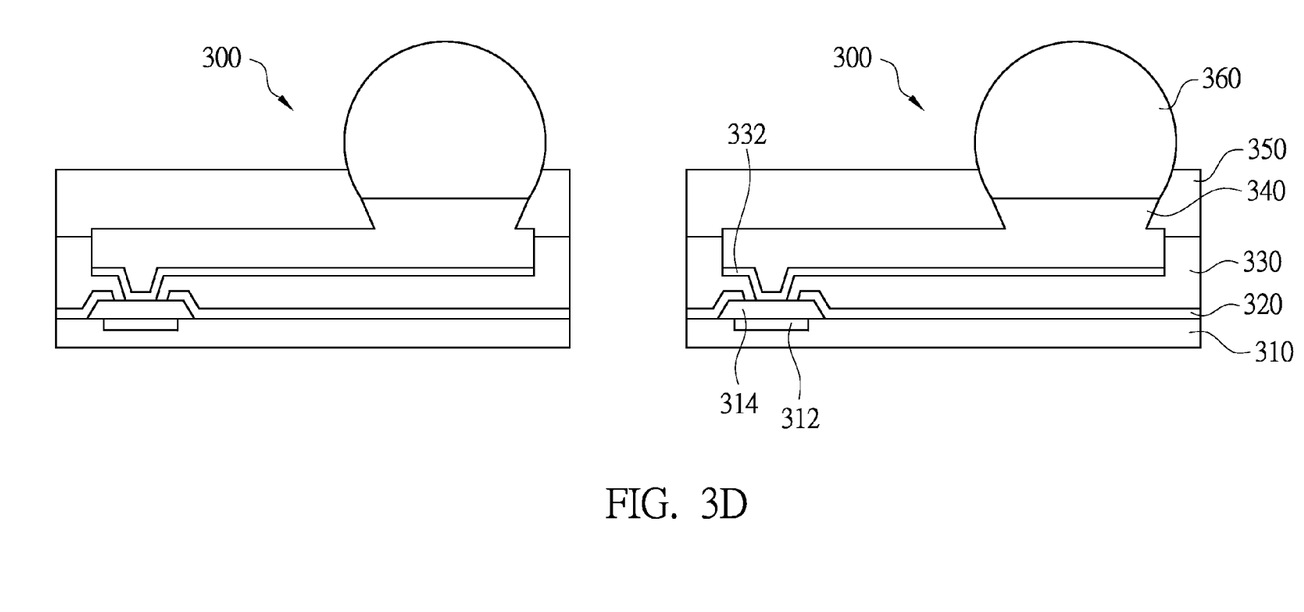

As shown in FIG. 3A, an exposed portion of the copper-containing layer 336 is etched by wet etching using the conductive bump 360 as a mask until the exposed portion of the copper-containing layer 236 is reduced to a thickness, thereby forming a monolithic copper-containing structure 340. Meanwhile, the wet etching also etches the interconnect structure 312 and the passivation layer 320 in the scribe lane 302, such that the scribe lane 302 contains little or no copper, thus making a subsequent die-sawing process easier. As shown in FIG. 3C, a second polymer insulating layer 350 is formed to encapsulate the monolithic copper-containing structure 340 and a portion of the conductive bump 360. As shown in FIG. 3D, the semiconductor substrate 310 can be diced easily to separate the semiconductor devices 300 due to little or no copper contained therein.

Figure 4:
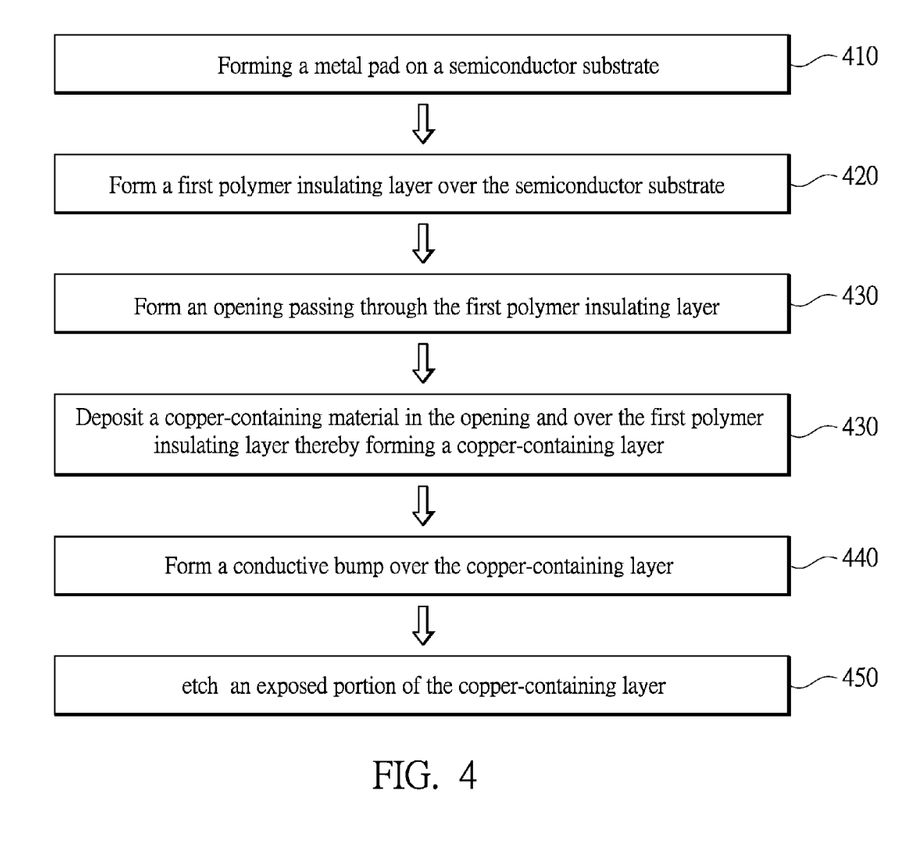
FIG. 4 is a flow chart of a method for fabricating a packaging structure in accordance with various embodiments.

Referring to FIG. 4 with FIG. 2A-FIG. 2K, FIG. 4 is a flow chart of a method for fabricating a packaging structure in accordance with various embodiments. The method begins at operation 410, where a metal pad 214 is formed on a semiconductor substrate 210. At operation 420, a first polymer insulating layer 230 is formed over the semiconductor substrate 210. At operation 430, an opening 222 passing through the first polymer insulating layer 230 is formed to expose a portion of the metal pad 214, as shown in FIG. 2A. At operation 440, a copper-containing material is deposited in the opening 222 and over the first polymer insulating layer 230, thereby forming a copper-containing layer 236 having a thickness t3 and a width w3 over the first polymer insulating layer 230, as shown in FIG. 2D and FIG. 2E. At operation 440, a conductive bump 260 having a width w4 is formed over the copper-containing layer 236, in which the width w4 of the conductive bump 260 is smaller than the width w3 of the copper-containing layer 236, as shown in FIG. 2G. At operation 450, an exposed portion of the copper-containing layer 236 is etched using the conductive bump 260 as a mask until the exposed portion of the copper-containing layer 236 is reduced to a thickness t4, thereby forming a monolithic copper-containing structure 240 including a bottom portion 240a, a top portion 240b and a via portion 240c.

In accordance with an embodiment, the present disclosure discloses a device including a semiconductor substrate, a metal pad, a first polymer insulating layer, a monolithic copper-containing structure and a conductive bump. The metal pad is disposed on the semiconductor substrate. The first polymer insulating layer overlies the semiconductor substrate and covers a portion of the metal pad. The monolithic copper-containing structure is disposed over the metal pad and the first polymer insulating layer, and is electrically connected to the metal pad. The monolithic copper-containing structure includes a via portion, a bottom portion and a top portion. The via portion contacts the metal pad embedded in the first polymer insulating layer. The bottom portion has a first thickness and a first width, in which the bottom portion includes a PPI line. The top portion adjoins the bottom portion, and has a second thickness and a second width, in which the second thickness is greater than the first thickness, and the first width is greater than the second width. The conductive bump is disposed over the top portion of the monolithic copper-containing structure.

In accordance with another embodiment, the present disclosure discloses a method for forming a device. In this method, a metal pad is formed on a semiconductor substrate, and a first polymer insulating layer is formed over the semiconductor substrate. An opening passing through the first polymer insulating layer is formed to expose a portion of the metal pad. A copper-containing material is deposited in the opening and over the first polymer insulating layer, thereby forming a copper-containing layer having a first thickness and a first width over the first polymer insulating layer. A conductive bump having a second width is formed over the copper-containing layer, in which the second width is smaller than the first width. An exposed portion of the copper-containing layer is etched using the conductive bump as a mask until the exposed portion is reduced to a second thickness, thereby forming a monolithic copper-containing structure.

In accordance with yet another embodiment, the present disclosure discloses a method for forming a device. In this method, a metal pad and a scribe lane are formed on a semiconductor substrate. A first polymer insulating layer is formed over the semiconductor substrate. An opening passing through the first polymer insulating layer is formed to expose a portion of the metal pad. A scribe lane opening is formed in the scribe lane. A copper-containing material is deposited in the opening of the first polymer insulating layer and the scribe lane opening and over the first polymer insulating layer, thereby forming a copper-containing layer having a first thickness and a first width over the first polymer insulating layer. A conductive bump having a second width is formed over the copper-containing layer, in which the second width is smaller than the first width. The scribe lane and a portion of the copper-containing layer are simultaneously etched using the conductive bump as a mask until the exposed portion is reduced to a second thickness, thereby forming a monolithic copper-containing structure.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
    depositing a copper-containing material over the semiconductor substrate, thereby forming a copper-containing layer having a first thickness and a first width over the semiconductor substrate;
    forming a conductive bump having a second width over the copper-containing layer, wherein the second width is smaller than the first width; and
    etching an exposed portion of the copper-containing layer using the conductive bump as a mask until the exposed portion is reduced to a second thickness, thereby forming a monolithic copper-containing structure comprising a top portion and a bottom portion adjoining the top portion, the top portion having a third thickness which is equal to the first thickness minus the second thickness, the bottom portion having the second thickness.

2. The method of claim 1, wherein the operation of etching the exposed portion of the copper-containing layer forms the second thickness ranging from 4 µm to 10 µm.

3. The method of claim 1, wherein the operation of etching the exposed portion of the copper-containing layer forms the third thickness ranging from 15 µm to 25 µm.

4. The method of claim 1, wherein the operation of etching the exposed portion of the copper-containing layer forms the third thickness greater than 35 µm.

5. The method of claim 1, wherein the operation of etching the exposed portion of the copper-containing layer comprises a wet etching process.

6. The method of claim 1, wherein the operation of etching the exposed portion of the copper-containing layer forms an undercut structure between the top portion and the bottom portion.

7. The method of claim 1, further comprising:
    forming an encapsulation layer encapsulating the monolithic copper-containing structure and a portion of the conductive bump.

8. The method of claim 1, further comprising:
    forming a metal pad on a semiconductor substrate;
    forming a first polymer insulating layer over the semiconductor substrate; and
    forming an opening passing through the first polymer insulating layer to expose a portion of the metal pad, wherein the operation of depositing the copper-containing material deposits the copper-containing material in the opening and over the first polymer insulating layer to form a via portion of the monolithic copper-containing structure.

9. The method of claim 8, further comprising:
    forming a second polymer insulating layer encapsulating the monolithic copper-containing structure and a portion of the conductive bump.

10. The method of claim 8, wherein the operation of depositing the copper-containing material comprises:
    forming a seed layer over the portion of the metal pad and the first polymer insulating layer;
    performing a photolithographic process to form a patterned photoresist on the seed layer;
    depositing the copper-containing material in the opening and over the seed layer; and
    stripping the patterned photoresist.

11. The method of claim 10, further comprising:
    removing the seed layer exposed from the copper-containing layer.

12. The method of claim 8, wherein the operation of forming the opening passing through the first polymer insulating layer comprises a first mask process, and the operation of depositing the copper-containing material thereby forming the copper-containing layer comprises a second mask process.

13. A method, comprising:
    forming a scribe lane on a semiconductor substrate;
    forming a scribe lane opening in the scribe lane;
    depositing a copper-containing material in the scribe lane opening and over the semiconductor substrate, thereby forming a copper-containing layer having a first thickness and a first width over the semiconductor substrate;
    forming a conductive bump having a second width over the copper-containing layer, wherein the second width is smaller than the first width; and
    simultaneously etching the scribe lane and a portion of the copper-containing layer using the conductive bump as a mask until the portion is reduced to a second thickness, thereby forming a monolithic copper-containing structure.

14. The method of claim 13, wherein the operation of simultaneously etching the scribe lane and the exposed portion of the copper-containing layer comprises a wet etching process.

15. The method of claim 13, wherein the monolithic copper-containing structure comprises a top portion and a bottom portion adjoining the top portion, and the operation of etching the exposed portion of the copper-containing layer forms an undercut structure between a top portion and the bottom portion.

16. The method of claim 13, further comprising:
    forming an encapsulation layer encapsulating the monolithic copper-containing structure and a portion of the conductive bump.

17. The method of claim 13 further comprising:
    forming a metal pad and a scribe lane on a semiconductor substrate;
    forming a first polymer insulating layer over the semiconductor substrate; and
    forming an opening passing through the first polymer insulating layer to expose a portion of the metal pad, wherein the operation of depositing the copper-containing material deposits the copper-containing material in the opening and over the first polymer insulating layer to form a via portion of the monolithic copper-containing structure.

18. The method of claim 17, further comprising:
forming a second polymer insulating layer encapsulating the monolithic copper-containing structure and a portion of the conductive bump.

19. The method of claim 17, wherein the operation of depositing the copper-containing material comprises:
forming a seed layer over the portion of the metal pad and the first polymer insulating layer;
performing a photolithographic process to form a patterned photoresist on the seed layer;
depositing the copper-containing material in the opening and over the seed layer; and
stripping the patterned photoresist.

20. The method of claim 17, further comprising:
removing the seed layer exposed from the copper-containing layer.

* * * * *